United States Patent
Humphrey et al.

(10) Patent No.: US 7,400,272 B2
(45) Date of Patent: Jul. 15, 2008

(54) HYBRID BINARY/THERMOMETER CODE FOR CONTROLLED-VOLTAGE INTEGRATED CIRCUIT OUTPUT DRIVERS

(75) Inventors: Guy Harlan Humphrey, Ft. Collins, CO (US); David Lawrence Linam, Ft. Collins, CO (US)

(73) Assignee: Avago Technologies General IP Pte Ltd, Singapore (SG)

( * ) Notice: Subject to any disclaimer, the term of this patent is extended or adjusted under 35 U.S.C. 154(b) by 140 days.

(21) Appl. No.: 11/450,090

(22) Filed: Jun. 10, 2006

(65) Prior Publication Data

US 2006/0290541 A1 Dec. 28, 2006

Related U.S. Application Data

(62) Division of application No. 10/835,906, filed on Apr. 30, 2004, now Pat. No. 7,088,129.

(51) Int. Cl.
*H03M 7/34* (2006.01)

(52) U.S. Cl. .......................... 341/51; 341/50

(58) Field of Classification Search .................. 341/50, 341/51; 326/30; 327/156
See application file for complete search history.

(56) References Cited

U.S. PATENT DOCUMENTS

| | | | |
|---|---|---|---|
| 5,717,342 A | 2/1998 | Lotfi et al. | |
| 6,043,682 A | 3/2000 | Dabral et al. | |
| 6,116,310 A | 9/2000 | Shinohara | |
| 6,198,635 B1 | 3/2001 | Shenoy et al. | |
| 6,326,802 B1 | 12/2001 | Newman et al. | |
| 6,400,771 B1 | 6/2002 | Humphrey | |
| 6,509,757 B1 * | 1/2003 | Humphrey | 326/30 |
| 6,522,185 B2 | 2/2003 | Helt et al. | |
| 6,586,974 B1 | 7/2003 | Humphrey et al. | |
| 6,664,805 B2 | 12/2003 | Gonzalez | |
| 6,683,482 B2 | 1/2004 | Humphrey et al. | |
| 6,710,617 B2 | 3/2004 | Humphrey | |
| 6,924,660 B2 | 8/2005 | Nguyen et al. | |
| 2003/0206043 A1 * | 11/2003 | Chung | 327/156 |

* cited by examiner

*Primary Examiner*—Jean B Jeanglaude

(57) ABSTRACT

A hybrid binary/thermometer code is employed to adjust the output impedance of a variable impedance output driver circuit having an impedance network comprising a plurality of impedance legs each programmably electrically connectable according to the hybrid binary/thermometer code in parallel between a voltage source and the signal pad. The plurality of impedance legs are partitioned into one or more set pairs of binary stepped impedance legs and corresponding thermometer stepped impedance legs. A binary set of calibration signals in the hybrid binary/thermometer code steps a given set of binary stepped impedance legs according to a binary code and a thermometer set of calibration signals in the hybrid binary/thermometer code steps the corresponding set of thermometer stepped impedance legs according to a thermometer code once per full count iteration of the binary set of calibration signals.

20 Claims, 5 Drawing Sheets

HYBRID BINARY/THERMOMETER CODE FOR CONTROLLED-VOLTAGE INTEGRATED CIRCUIT OUTPUT DRIVERS

CROSS REFERENCE TO RELATED APPLICATION

This application is a divisional application, which is based on, and claims priority to, U.S. patent application Ser. No. 10/835,906, now U.S. Pat. No. 7,088,129 B2, issued Aug. 8, 2006, filed on Apr. 30, 2004, and which is incorporated herein by reference in its entirety.

BACKGROUND OF THE INVENTION

The present invention pertains generally to variable impedance output drivers in integrated circuits, and more particularly to a novel hybrid code for controlling the output impedance of integrated circuit output drivers due to variations in manufacturing process, voltage, and temperature.

Integrated circuits are commonly packaged as chips. An integrated circuit communicates with devices outside the chip via input and output signal pads on the exterior of the chip. Inside the chip, the signal pads are connected to signal receiver and signal driver circuitry, as appropriate, to receive incoming signals or to drive outgoing signals.

The signal pads on a chip are connected to the packaging of the chip (e.g., a pin) which is then typically connected to respective signal traces on a printed circuit board. The signal traces may connect the chip to other integrated circuit chips, electronic devices, or connectors on the printed circuit board that connect to external (i.e., off-board) devices. The electrical connection between the signal pad of the integrated circuit die and signal trace of the printed circuit board through the packaging of the chip is characterized by parasitic resistance, inductance, and capacitance, which interferes with the transmission of the signal from the signal pad. The transmission line characteristics of the printed circuit board signal trace itself, including parasitic resistance, capacitance, and inductance, also interfere with the quality of the transmission of the signal from the signal pad. All of the foregoing add to the load impedance which must be driven by the output driver circuit.

Due to the parasitic resistance, capacitance, and inductance which is present on chip-to-chip signal transmission lines, the driver circuits that drive those transmission lines typically includes circuitry designed to avoid excessive voltage swings, or "ringing", when signal switching occurs. Ringing must be avoided while still switching as fast as possible to meet the high speed performance requirements of modern integrated circuits.

As known by those skilled in the art, it is important to match the output impedance of a given signal driver to the characteristic impedance of the transmission line it drives in order to avoid signal reflections due to voltage level switching on the pad, and therefore undesirable signal degradation.

Matching the impedance of an output driver to the characteristic impedance of the signal transmission line is problematic for several reasons. First, process variations inherent in the manufacturing process of integrated circuits, such as the transistor implanting doping level, the effective length of channels in the field effect transistors (FETs), the thickness of the gate oxide for transistors, and the diffusion resistance, can cause the output impedance of two supposedly identical circuits to differ. In particular, variations in any or all of the above process parameters can cause different integrated circuits intended to perform the same function to be classified as "slow", "nominal", or "fast". In other words, two supposedly identical integrated circuits can vary in any or all of the process parameters. As these parameters approach the fast case, the resistance of many components within a chip is decreased. In the opposite extreme, as the process parameters stray further and further from the ideal case, the performance of the chip is degraded, specifically, the resistance of the many components within the chip is increased. This situation is referred to as the "slow" case.

In addition, variations in voltage and temperature can cause variations in the output impedance of a given chip. Specifically, the driver output impedance can vary significantly between variations in the operating voltage even within a small operating voltage tolerance range. In another example, when the temperature of an integrated circuit approaches its maximum operating temperature, the resistance of the integrated circuit components increases.

In view of the above, variable impedance output drivers have been developed to allow adjustment of the driver output impedance due to variations in manufacturing process, voltage, and temperature. Typically the characteristic impedance of transmission lines connected to I/O pads of the output drivers are known and/or can be measured, and once known or measured, a precision external resistor $R_{EXT}$ of corresponding value may be provided on the printed circuit board to serve as a reference impedance from which to match. Alternatively, instead of precision external resistor $R_{EXT}$, other types of arrangements can be used.

It is becoming standard to use a programmable impedance network to match the impedance of an output signal pad driven by an output driver to the external resistor $R_{EXT}$. In an impedance network, a plurality of impedance legs, each of which is characterized by a predetermined impedance, are programmably connectable between a voltage source and a node coupled to an output pad driven by an output driver. As known in the art, the term "node" refers to a pad, a trace, a wire, an electrical conductor, or any electrically connected combination and/or equivalent thereof, such that any point of the "node" is characterized by the same electrical state as all other points of the "node", subject to a margin of error determined by the characteristic resistance, capacitance, and inductance between points of the node. When an appropriate combination of parallel legs of the impedance network are actively connected between the voltage source and node, such that a voltage $V_{DIV}$ measured at a reference point is one half (½) a voltage V applied across the series combination of the external resistor $R_{EXT}$ and the active parallel legs of the impedance network, then it is known that the external resistor $R_{EXT}$ and active parallel legs of transistors within the impedance network are equally sharing/dividing the voltage V. That is, if two series portions are equally sharing/dividing a voltage, then such two series portions have the same impedance. Accordingly, as a result of the above method, the output impedance of the pad coupled to the output driver is "adapted" to external resistor $R_{EXT}$, as the active parallel legs of the impedance network are providing an impedance (e.g., resistance) which matches that of external resistor $R_{EXT}$.

The above "adaptive" procedure may be performed not only upon initialization (e.g., reset) of the integrated circuit, but may also be continuously or periodically performed during operation of the integrated circuit. Such continuous/periodic operation is advantageous because environmental parameters (e.g., voltage, temperature, etc.) of the integrated circuit change over time (e.g., the integrated circuit becomes hotter with operation which changes on-die impedances), and thus the arrangements of the present invention can be adaptive to change continuously/periodically.

One prior art technique for accomplishing impedance matching of output pads for integrated circuits is described in U.S. Pat. No. 6,118,310 to Esch, Jr. and assigned to the same assignee of interest, entitled "Digitally Controlled Output Driver and Method for Impedance Matching", herein incorporated by reference for all that it teaches. In the technique described therein, output driver impedance matching is accomplished by programmably enabling a combination of FETs arranged in parallel whose combined impedance closely matches the characteristic impedance of the transmission line.

Such prior art variable impedance output drivers typically use a pure thermometer code for the PVT impedance matching control in order to limit the change in output impedance when the PVT control code is updated. In particular, an impedance network having n parallel legs may implement an n-bit "thermometer" code $T_{0::n-1}$. The state of each bit in the n-bit code $T_{0::n-1}$ controls activation of respective legs in the impedance network. In a thermometer code, when a bit $T_i$ of the code $T_{0::n-1}$ is activated (set to "1"), all of the lower-order bits $T_1$ to $T_{i-1}$ are also activated. Thus, in a pure thermometer code impedance matching circuit, a first impedance leg is activated and then each subsequent impedance leg is activated until the desired output impedance is achieved. Accordingly, at least one impedance leg is always activated to ensure that during the switching of impedance legs on or off, the impedance legs are never switched from all off to all on or vice versa, which would result in a spike in the output impedance. Table 1 illustrates a pure 11-bit thermometer code, wherein each bit 0::10 in the code word T represents an incremental admittance step of 10%—that is each impedance leg is weighted by a 10% incremental impedance amount.

TABLE 1

| $T_{10}$ | $T_9$ | $T_8$ | $T_7$ | $T_6$ | $T_5$ | $T_4$ | $T_3$ | $T_2$ | $T_1$ | $T_0$ | Admittance (Y = 1/Z) | Impedance (Z) |
|---|---|---|---|---|---|---|---|---|---|---|---|---|
| 0 | 0 | 0 | 0 | 0 | 0 | 0 | 0 | 0 | 0 | 1 | 1 | 1 |
| 0 | 0 | 0 | 0 | 0 | 0 | 0 | 0 | 0 | 1 | 1 | 1 + .1 | .909 |
| 0 | 0 | 0 | 0 | 0 | 0 | 0 | 0 | 1 | 1 | 1 | 1 + .2 | .833 |
| 0 | 0 | 0 | 0 | 0 | 0 | 0 | 1 | 1 | 1 | 1 | 1 + .3 | .769 |
| 0 | 0 | 0 | 0 | 0 | 0 | 1 | 1 | 1 | 1 | 1 | 1 + .4 | .714 |
| 0 | 0 | 0 | 0 | 0 | 1 | 1 | 1 | 1 | 1 | 1 | 1 + .5 | .667 |
| 0 | 0 | 0 | 0 | 1 | 1 | 1 | 1 | 1 | 1 | 1 | 1 + .6 | .625 |
| 0 | 0 | 0 | 1 | 1 | 1 | 1 | 1 | 1 | 1 | 1 | 1 + .7 | .588 |
| 0 | 0 | 1 | 1 | 1 | 1 | 1 | 1 | 1 | 1 | 1 | 1 + .8 | .555 |
| 0 | 1 | 1 | 1 | 1 | 1 | 1 | 1 | 1 | 1 | 1 | 1 + .9 | .526 |

In the example thermometer code of TABLE 1, the controllable range of the output impedance is limited to between 1 and 0.526, and the sensitivity is 0.1 or 10% change in admittance for each step. As also illustrated by TABLE 1, a pure thermometer code requires one bit for each step. Accordingly, one of the drawbacks of a pure thermometer code is the large number of bits (and therefore control lines) required to allow a large range of output impedance. The number of control lines increases exponentially as the degree of required step sensitivity increases. For example, if it would be desirable to step the admittance only 1% in order to increase the sensitivity of each step, the PVT control circuit would require 101 control lines, or tenfold the number of lines required for adjusting it to the nearest 10%. Alternatively, if it were desired to increase the range of adjustable output impedance from 1 to 0.25, in the example of TABLE 1 with each step changing the admittance by 10%, an additional twenty bits (control lines) would be required.

Accordingly, although an increased sensitivity range for adjusting the PVT output impedance is desirable, the number of bits required to implement any significant range and/or sensitivity using a pure thermometer code is outweighed by the added design complexity and chip real estate required to implement it.

An alternative solution to use of a pure thermometer code is the use of a pure binary weighted code whereby each leg of the PVT control circuit is binary weighted to comprise a resistive device having an admittance corresponding to a combination of its binary weighted bit position. In other words, each impedance leg in the impedance network has an admittance of $2_{(bit\ position)}Y$, where Y is a predefined minimum admittance appropriate to the design. In other words, if bit $B_0$ of a binary-coded calibration word $B_{0::n-1}$ controls a FET with admittance Y, bit $B_1$ of the calibration word $B_{0::n-1}$ controls a FET with admittance 2*Y, bit $B_2$ of the calibration word $B_{0::n-1}$ controls a FET admittance 4*Y, and so on. Thus, the impedance of each leg of the impedance network corresponds to the weighted position of the bit in the binary code that controls the leg. More particularly, if the calibration word $B_{0::n-1}$ comprises 4 bits, the impedance leg controlled by bit $B_0$ has a relative impedance weighting of 1. Similarly, the impedance leg controlled by bit $B_1$ has a relative impedance weighting of 2, and the impedance leg controlled by bit $B_2$ has a relative impedance weighting of 4, and the impedance leg controlled by bit $B_3$ has a relative impedance weighting of 8. In effect, as the binary count of the calibration word $B_{0::n-1}$ increments, more impedance is added in parallel in the impedance network, and the output impedance on the signal pad drops. TABLE 2 illustrates an example of a pure 4-bit binary weighted code.

TABLE 2

| $B_3$ | $B_2$ | $B_1$ | $B_0$ | Admittance (Y = 1/Z) | Impedance (Z) |
|---|---|---|---|---|---|
| 0 | 0 | 0 | 0 | 0 | infinite |
| 0 | 0 | 0 | 1 | 0.1 | 10 |
| 0 | 0 | 1 | 0 | 0.2 | 5 |
| 0 | 0 | 1 | 1 | 0.3 | 3.333 |
| 0 | 1 | 0 | 0 | 0.4 | 2.5 |
| 0 | 1 | 0 | 1 | 0.5 | 2 |
| 0 | 1 | 1 | 0 | 0.6 | 1.667 |
| 0 | 1 | 1 | 1 | 0.7 | 1.429 |
| 1 | 0 | 0 | 0 | 0.8 | 1.25 |
| 1 | 0 | 0 | 1 | 0.9 | 1.11 |
| 1 | 0 | 1 | 0 | 1.0 | 1 |
| 1 | 0 | 1 | 1 | 1.1 | .909 |
| 1 | 1 | 0 | 0 | 1.2 | .833 |
| 1 | 1 | 0 | 1 | 1.3 | .769 |
| 1 | 1 | 1 | 0 | 1.4 | .714 |
| 1 | 1 | 1 | 1 | 1.5 | .667 |

As illustrated in TABLE 2, the benefit of using a binary weighted code is its ability to achieve a larger range of output impedance using fewer bits (or PVT control lines). However, in a pure binary weighted code, a step-wise increment does not ensure that all legs currently activated will remain activated at the next step. This can result in a jump in output impedance, which may cause partial reflection of a signal incoming from a transmission line coupled to the output pad. Further, if a transmission line is low because one of the drivers is active, the impedance transition may launch a wave onto the transmission line. This can result in an unacceptable noise glitch. For example, suppose the current binary weighted calibration code B that controls a 4-leg impedance network has a value of binary 0111 (corresponding to an admittance of 0.7) and the code B is to be incrementally stepped to binary 1000 (corresponding to an admittance value of 0.8). When the electrical connections of the impedance legs are switched from 0111 to 1000, it is possible that for a very short time the switches may be in a state such that all the switched impedance legs are simultaneously momentarily on (corresponding to a binary value of "1111") or simultaneously momentarily off (corresponding to a binary value of "0000"). In this example and according to TABLE 2, the output impedance $Z_{OUT}$ could momentarily change from $Z_{OUT}$=1.429 (corresponding to an admittance of 0.7) to $Z_{OUT}$=0.667 (corresponding to an admittance of 1.5, or from $Z_{OUT}$=1.429 (corresponding to an admittance of 0.7) to $Z_{OUT}$=infinite (corresponding to an admittance of 1.5). As illustrated by this example, the more bits in the code that must be switched between one step value to the next increases the probability of an undesirable spike in the output impedance seen on the signal pad.

Hybrid PVT codes have been developed, for example as described in U.S. Pat. No. 6,326,802 to Newman et al., entitled "On-Die Adaptive Arrangements For Continuous Process, Voltage, And Temperature Compensation", herein incorporated by reference for all that it teaches. In the technique described therein, PVT compensation is achieved using a hybrid binary/linear (thermometer) adaptive arrangement during initialization to initially adapt to an external resistor $R_{EXT}$, and thereafter locks the binary adaptive arrangement to the adapted impedance such that the binary adaptive arrangement cannot generate impedance/noise glitches after initialization. Once the binary adaptive arrangement has been used to initially adapt to $R_{EXT}$ during initialization then the hybrid binary/linear adaptive arrangement utilizes a linear (thermometer) adaptive arrangement to continuously readapt to $R_{EXT}$ to compensate for operational and environmental variations after initialization. However, while the hybrid binary/linear arrangement of U.S. Pat. No. 6,326,802 may be used to decrease the number of bits used for PVT compensation, the binary and linear arrangements are mutually exclusive during operation. Thus, during initialization, the output impedance is susceptible to impedance/noise glitches, and after initialization, the sensitivity range is limited by the number of bits lines.

Accordingly, a need exists for a PVT control encoding technique that allows for a higher output impedance range with fewer control lines, while preventing spikes in the output impedance on the signal pads.

SUMMARY OF THE INVENTION

The present invention is a novel variable impedance output driver control circuit and method for programming the same that employs a hybrid binary/thermometer coded adaptive scheme when adjusting the output impedance of an output driver to take into account variations in process, voltage, and temperature. The coding scheme of the invention achieves a high range of sensitivity with a minimal number of control lines while preventing spikes in the output impedance on the signal pad.

In accordance with one embodiment of the invention, a hybrid binary/thermometer coded adaptive scheme is employed in a variable impedance network to variably adjust the output impedance of an output driver circuit. The variable impedance network is configured with a plurality of impedance legs electrically connected between a voltage source and a node that is electrically coupled to the output of the output driver circuit. Preferably, the sets of impedance legs stepped by the binary stepped bits are weighted in increasing order of admittance, and in particular, in a binary weighting in order of the respective predetermined bit position of its corresponding calibration signal in the calibration word.

Combinations of the impedance legs are connected and disconnected from the node according to a hybrid binary/thermometer code of the invention. In an exemplary embodiment, the impedance legs are partitioned into a plurality of sets of binary stepped impedance legs and corresponding thermometer stepped impedance legs. A calibration word having a plurality of bits each corresponding to and controlling a different one of the impedance legs is partitioned into a plurality of sets of binary stepped bits and corresponding thermometer stepped bits. One pair of a set of binary stepped bits and corresponding set of thermometer stepped bits is activated for stepping at a time. Each set of binary stepped bits is stepped according to a binary code, and each corresponding set of thermometer stepped bits is stepped according to a thermometer code once per full count iteration of its corresponding set of binary bits.

On an increment step, if both the binary bits and corresponding thermometer bits of all active pairs of bit sets are incrementally saturated (i.e., all bits in all active set pairs are "1"), a next pair of sets of binary stepped bits and corresponding thermometer stepped bits is activated. The cumulative set of activated binary stepped bits is stepped according to a binary code, and the next set of thermometer-stepped bits is stepped according to a thermometer code once per full count iteration of the cumulative set of activated binary bits.

On a decrement step, if both the binary bits and corresponding thermometer bits of a given pair of bit sets are decrementally saturated (i.e., all bits in the set pair are "0"), the pair of sets of binary stepped bits and corresponding thermometer stepped bits are deactivated. The cumulative set of activated binary stepped bits is stepped according to a binary code, and the most recently activated set of thermometer-stepped bits is stepped according to a thermometer code once per full count iteration of the cumulative set of activated binary bits.

The process may be repeated as necessary to match the output impedance of the output driver circuit to the load impedance of the output pad, or until all bits of the calibration word (and hence, all impedance legs) are activated.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and system for increasing the range and sensitivity of a variable impedance output driver control circuit is described in detail hereinafter. Although the invention is described in terms of specific illustrative embodiments, it is to be understood that the illustrative embodiments are shown by way of example only and the scope of the invention is not intended to be limited thereby.

Figure 1:
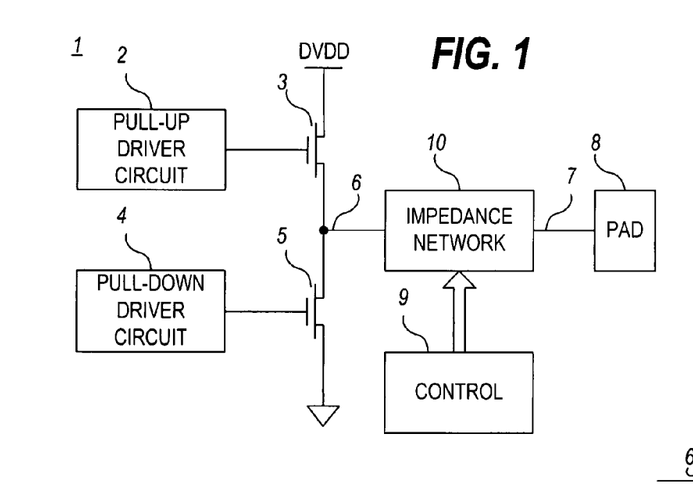
FIG. 1 is a schematic block diagram of a variable impedance output driver circuit.

Turning now to FIG. 1, there is shown a block diagram illustrating a variable impedance output driver circuit 1. As shown, the driver circuit 1 includes a pull-up predriver circuit 2 which operates to drive an output value from a low state to a high state (e.g., logic zero to logic one), and a pull-down predriver circuit 4 which operates to drive an output value from a high state to a low state. The pull-up predriver circuit 2 controls a switching device 3, implemented in the illustrative embodiment by an N-channel field effect transistor (NFET), that switchably connects a node 6 coupled to the output pad 8 to a first voltage source, e.g., DVDD. Similarly, the pull-down predriver circuit 4 controls a switching device 5, also implemented in the illustrative embodiment by an NFET, that switchably connects the node 6 coupled to the output pad 8 via conductor 7 to a second voltage source, e.g., the chip ground. An impedance network 10 is interposed between the node 6 and the driver pad 8. The impedance network 10 provides a controllably variable impedance, which serves to vary the output impedance of the driver circuit 1 on signal pad 8 to match the board trace impedance. Control circuit 9 controls the impedance provided by the impedance network 10. The output of the impedance network 10 is routed to the driver pad 8 via conductor 7.

Figure 2:
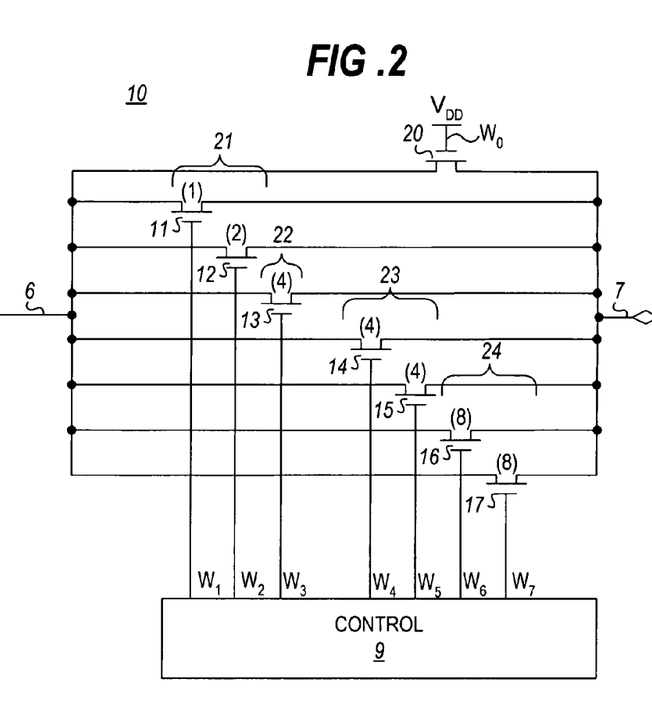
FIG. 2 is a schematic diagram of an impedance network implemented in accordance with the invention for the variable impedance output driver of FIG. 1.

To more particularly describe the structure and operation of the impedance network 10, reference is now made to FIG. 2, which illustrates this circuitry in more detail. Specifically, the impedance network 10 is shown in relation to the node 6 and conductor 7, and control circuit 9. The impedance network 10 includes an impedance leg 20 that is connected between node 6 and conductor 7, and a plurality of impedance legs 11-17 programmably electrically connectable in parallel between the node 6 and conductor 7 by a control circuit 9. In the preferred embodiment, the impedance legs 11-17 and 20 are implemented with field effect transistors (FETs), but could be implemented using other components such as a resistor in series with a switch. In the preferred embodiment, each of the FETs 11-17 and 20 is defined by a channel width that defines the admittance of that FET device. When activated (i.e., turned on to conduct current), each FET provides an electrical connection between node 6 and conductor 7 thereby allowing current flow and contributing to the combined parallel resistance of the impedance network. When more than one of the FET devices 11-17 is turned on, the characteristic resistance of the enabled FETs combine in parallel to provide a lower combined resistance. In this way, the output impedance of the driver circuit 1 may be varied.

The impedance leg 20 is always activated, allowing a signal to pass from node 6 to conductor 7, to prevent impedance jumps which can result in noise glitches on the output pad 8 that may occur momentarily as a result of the switching on or off of the impedance legs 11-17.

The control circuit 9 generates a digital calibration word $W_{1::7}$ to activate selected ones of the switchable impedance legs 11-17 to precisely control the output impedance of the driver circuit 1 in accordance with the method described hereinafter in FIGS. 3A-3C. Each respective bit in the calibration word $W_{1::7}$ corresponds to, and controls, a different one of the impedance legs 11-17. In the preferred embodiment, each respective bit $W_1$ through $W_7$ of the calibration word $W_{1::7}$ drives a different respective gate of a corresponding respective FET device implementing the respective corresponding impedance legs 11-17.

In the illustrative embodiment, the admittance of impedance legs 11-17 of the impedance network 10 are weighted relative to the admittance of impedance leg 20 as follows: impedance leg 11 is characterized by an admittance value of 10% of the admittance value of "always on" impedance leg 20; impedance leg 12 is characterized by an admittance value that is two times that of the first impedance leg 11; impedance leg 13 is characterized by an admittance value that is four times that of the first impedance leg 11; impedance leg 14 is characterized by an admittance value that is four times that of the first impedance leg 11; impedance leg 15 is characterized by an admittance value that is four times that of the first impedance leg 11; impedance leg 16 is characterized by an admittance value that is eight times that of the first impedance leg 11; and impedance leg 17 is characterized by an admittance value that is eight times that of the first impedance leg 11.

The impedance legs 11-17 are partitioned into a plurality of sets 21, 22, 23, and 24. Impedance leg set 21 includes impedance legs 11 and 12; impedance leg set 22 includes impedance leg 13; impedance leg set 23 includes impedance legs 14 and 15; and impedance leg set 24 includes impedance legs 16 and 17.

TABLE 3 illustrates an exemplary hybrid binary/thermometer code in accordance with the invention for a 7-bit output impedance calibration word $W_{1::7}$ for controlling the impedance network 10 of FIG. 2. Each bit position $W_0$-$W_7$ in TABLE 3 corresponds to a control signal for controlling the activation (represented by a "1" in TABLE 3) or deactivation (represented by a "0" in TABLE 3) of a respective impedance leg 11-17. Thus, when the value of a bit in TABLE 3 is defined as a "0", the impedance leg corresponding to the bit is electrically disconnected from between node 6 and node 7, and therefore does not contribute to the parallel resistance of the impedance network 10. Likewise, when the value of a bit in TABLE 3 is defined as a "1", the impedance leg corresponding to the bit is electrically connected between node 6 and node 7, and therefore contributes to the parallel resistance of the impedance network 10.

TABLE 3

| Leg Weighting | $W_7$ | $W_6$ | $W_5$ | $W_4$ | $W_3$ | $W_2$ | $W_1$ | $W_0$ | Admittance (Y = 1/Z) | Impedance (Z) |
|---|---|---|---|---|---|---|---|---|---|---|
| Count #0 | 0 | 0 | 0 | 0 | 0 | 0 | 0 | 1 | 1 | 1 |
| Count #1 | 0 | 0 | 0 | 0 | 0 | 0 | 1 | 1 | 1 + .1 = 1.1 | .909 |
| Count #2 | 0 | 0 | 0 | 0 | 0 | 1 | 0 | 1 | 1 + .2 = 1.2 | .833 |
| Count #3 | 0 | 0 | 0 | 0 | 0 | 1 | 1 | 1 | 1 + .2 + .1 = 1.3 | .769 |
| Count #4 | 0 | 0 | 0 | 1 | 0 | 0 | 0 | 1 | 1 + .4 = 1.4 | .714 |
| Count #5 | 0 | 0 | 0 | 1 | 0 | 0 | 1 | 1 | 1 + .4 + .1 = 1.5 | .667 |
| Count #6 | 0 | 0 | 0 | 1 | 0 | 1 | 0 | 1 | 1 + .4 + .2 = 1.6 | .625 |

TABLE 3-continued

| Leg Weighting | Bit Position | | | | | | | | Admittance | Impedance |
|---|---|---|---|---|---|---|---|---|---|---|
| | $W_7$ | $W_6$ | $W_5$ | $W_4$ | $W_3$ | $W_2$ | $W_1$ | $W_0$ | (Y = 1/Z) | (Z) |
| Count #7 | 0 | 0 | 0 | 1 | 0 | 1 | 1 | 1 | 1 + .4 + .2 + .1 = 1.7 | .588 |
| Count #8 | 0 | 0 | 1 | 1 | 0 | 0 | 0 | 1 | 1 + .4 + .4 = 1.8 | .555 |
| Count #9 | 0 | 0 | 1 | 1 | 0 | 0 | 1 | 1 | 1 + .4 + .4 + .1 = 1.9 | .526 |
| Count #10 | 0 | 0 | 1 | 1 | 0 | 1 | 0 | 1 | 1 + .4 + .4 + .2 = 2.0 | .500 |
| Count #11 | 0 | 0 | 1 | 1 | 0 | 1 | 1 | 1 | 1 + .4 + .4 + .2 + .1 = 2.1 | .476 |
| Count #12 | 0 | 0 | 1 | 1 | 1 | 0 | 0 | 1 | 1 + .4 + .4 + .4 = 2.2 | .455 |
| Count #13 | 0 | 0 | 1 | 1 | 1 | 0 | 1 | 1 | 1 + .4 + .4 + .4 + .1 = 2.3 | .435 |
| Count #14 | 0 | 0 | 1 | 1 | 1 | 1 | 0 | 1 | 1 + .4 + .4 + .4 + .2 = 2.4 | .417 |
| Count #15 | 0 | 0 | 1 | 1 | 1 | 1 | 1 | 1 | 1 + .4 + .4 + .4 + .2 + .1 = 2.5 | .400 |
| Count #16 | 0 | 1 | 1 | 1 | 0 | 0 | 0 | 1 | 1 + .8 + .4 + .4 = 2.6 | .385 |
| Count #17 | 0 | 1 | 1 | 1 | 0 | 0 | 1 | 1 | 1 + .8 + .4 + .4 + .1 = 2.7 | .370 |
| Count #18 | 0 | 1 | 1 | 1 | 0 | 1 | 0 | 1 | 1 + .8 + .4 + .4 + .2 = 2.8 | .357 |
| Count #19 | 0 | 1 | 1 | 1 | 0 | 1 | 1 | 1 | 1 + .8 + .4 + .4 + .2 + .1 = 2.9 | .345 |
| Count #20 | 0 | 1 | 1 | 1 | 1 | 0 | 0 | 1 | 1 + .8 + .4 + .4 + .4 = 3.0 | .333 |
| Count #21 | 0 | 1 | 1 | 1 | 1 | 0 | 1 | 1 | 1 + .8 + .4 + .4 + .4 + .1 = 3.1 | .323 |
| Count #22 | 0 | 1 | 1 | 1 | 1 | 1 | 0 | 1 | 1 + .8 + .4 + .4 + .4 + .2 = 3.2 | .313 |
| Count #23 | 0 | 1 | 1 | 1 | 1 | 1 | 1 | 1 | 1 + .8 + .4 + .4 + .4 + .2 + .1 = 3.3 | .303 |
| Count #24 | 1 | 1 | 1 | 1 | 0 | 0 | 0 | 1 | 1 + .8 + .8 + .4 + .4 = 3.4 | .294 |
| Count #25 | 1 | 1 | 1 | 1 | 0 | 0 | 1 | 1 | 1 + .8 + .8 + .4 + .4 + .1 = 3.5 | .286 |
| Count #26 | 1 | 1 | 1 | 1 | 0 | 1 | 0 | 1 | 1 + .8 + .8 + .4 + .4 + .2 = 3.6 | .278 |
| Count #27 | 1 | 1 | 1 | 1 | 0 | 1 | 1 | 1 | 1 + .8 + .8 + .4 + .4 + .2 + .1 = 3.7 | .270 |
| Count #28 | 1 | 1 | 1 | 1 | 1 | 0 | 0 | 1 | 1 + .8 + .8 + .4 + .4 + .4 = 3.8 | .263 |
| Count #29 | 1 | 1 | 1 | 1 | 1 | 0 | 1 | 1 | 1 + .8 + .8 + .4 + .4 + .4 + .1 = 3.9 | .256 |
| Count #30 | 1 | 1 | 1 | 1 | 1 | 1 | 0 | 1 | 1 + .8 + .8 + .4 + .4 + .4 + .2 = 4.0 | .250 |
| Count #31 | 1 | 1 | 1 | 1 | 1 | 1 | 1 | 1 | 1 + .8 + .8 + .4 + .4 + .4 + .2 + .1 = 4.1 | .244 |

In accordance with the exemplary embodiment of the invention shown in FIG. 2, and as also illustrated in TABLE 3, bit $W_0$ which controls activation of impedance leg 20 is always activated (i.e., the gate of FET 20 is tied to $V_{DD}$ to allow saturating current flow through impedance leg 20 between node 6 and conductor 7). Impedance leg 20 defines the highest impedance. Alternatively, because impedance leg 20 is always activated, the switching device of the impedance leg 20 can be hardwired to be always on, or implemented with a device that is not switchable (e.g., a standard resistor) eliminating the need for the control circuit 9 to generate bit $W_0$ in the calibration word.

As illustrated in TABLE 3, calibration word bits $W_3$, $W_2$, $W_1$ count according to a pseudo-binary counting scheme. As previously described, the impedance legs 11, 12, and 13 are respectively characterized by admittances $Y_1$, $Y_2$, $Y_3$ of 10%, 20%, and 40% of $Y_0$, the admittance of impedance leg 20. Thus, if impedance leg FET 20 is weighted with an admittance $Y_0$, impedance leg FET 11 is weighted with an admittance $Y_1 = 10\% * Y_0$, impedance leg 12 is weighted with an admittance $Y_2 = 2*Y_1$, and impedance leg FET 13 is weighted with an admittance $Y_3 = 4*Y_1$.

In contrast, calibration word bits $W_7$, $W_6$, $W_5$, $W_4$ count according to a thermometer counting scheme. In the embodiment of FIG. 2, the impedance legs 14, 15, 16, and 17 are preferably respectively characterized by admittances $Y_7$, $Y_6$, $Y_5$, $Y_4$ of 80%, 80%, 40%, and 40% of $Y_0$. Accordingly, impedance leg FET 14 is weighted with an admittance $Y_4 = 4*Y_1$, impedance leg FET 15 is weighted with an admittance $Y_5 = 4*Y_1$, impedance leg 16 is weighted with an admittance $Y_2 = 8*Y_1$, and impedance leg FET 17 is weighted with an admittance $Y_3 = 8*Y_1$.

The goal of the control circuit 9 is to switch the minimum number of impedance legs between count steps while maintaining a high degree of sensitivity and impedance range. To accomplish this, the control circuit 9 implements the hybrid binary/thermometer code of TABLE 3 when stepping the calibration word $W_{1::7}$ up or down.

When the impedance legs are weighted according to the illustrative embodiment, the sensitivity of the impedance network when stepped according to the hybrid binary/thermometer code defined in TABLE 3 is 10%. Thus, an increment or decrement of the programmed calibration word $W_{7::1}$ will result in a 10% change in admittance from the previous step. In addition, the range of the impedance network 10 is 1 to 4.1, which, by comparison to TABLE 2, is much higher than a pure thermometer code can yield with the same number of bits. For example, if the impedance of the impedance leg FET 20 is 10 ohms, then the minimum impedance that the impedance network can yield is 10/4.1 or 24.39 ohms. A pure thermometer code having the same number of impedance legs would yield 10/1.7 or 58.8 ohms. Although use of a pure binary code having the same number of impedance legs would yield a higher range, as discussed in the background section, a pure binary code implementation is problematic because it exposes the output pad to a high prevalence of impedance spikes when switching between calibration word steps. Thus, it will be appreciated that the hybrid binary/thermometer coding scheme of the invention affords the sensitivity of a pure binary coded scheme and increased impedance range over a pure thermometer coding scheme.

Figure 3A:
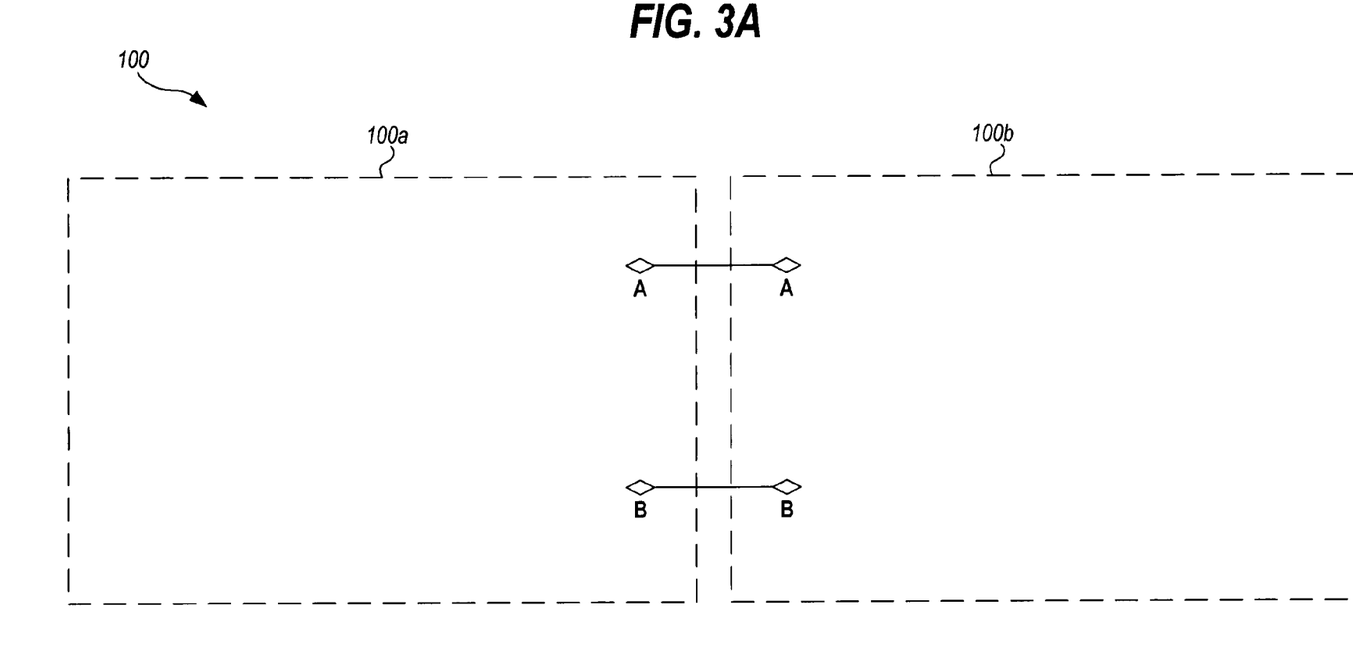
FIG. 3A is a map of a flowchart of the method of the invention detailed in FIGS. 3B and 3C.

FIG. 3A is a map of a flowchart of an exemplary embodiment of a method 100 of the invention for stepping a hybrid binary/thermometer code. The method 100 is shown in two parts 100a in FIG. 3B and 100b in 3C. In this method 100, it is assumed that the bits of the hybrid binary/thermometer code are partitioned into sets of binary bits and corresponding sets of thermometer bits. When used to implement the control circuit 9 in FIG. 2 to generate the calibration word $W_{1::7}$, bits $W_1$ and $W_2$ form one binary bit set, and bits $W_4$ and $W_5$ form its corresponding thermometer bit set. Bit $W_3$ forms another binary bit set, and bits $W_6$ and $W_7$ form its corresponding thermometer bit set.

Figure 3B:
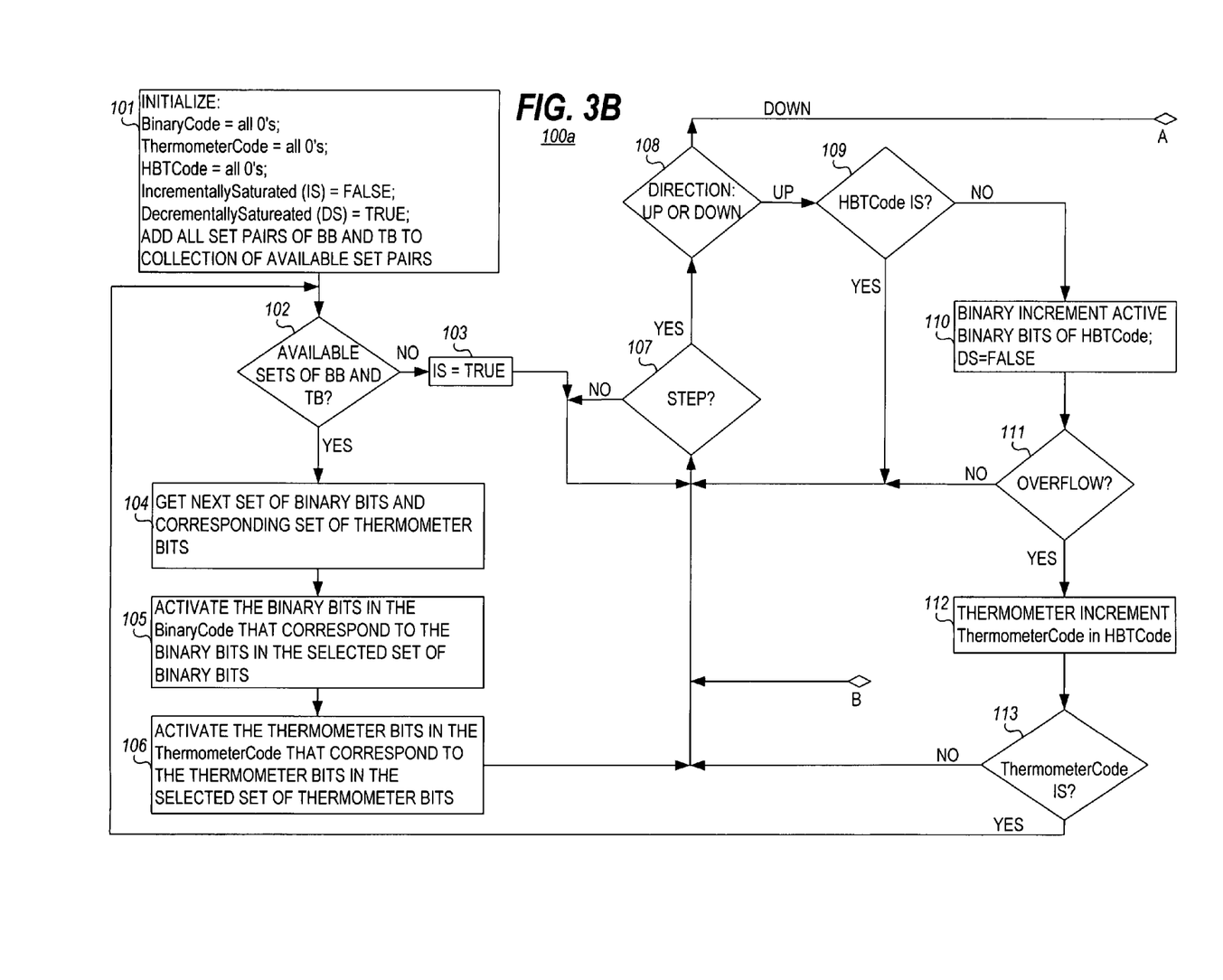
FIG. 3B is a first part of the flowchart of a preferred embodiment of the invention.

Turning now in detail to the method 100, and in particular to method part 100a in FIG. 3B, the method 100 begins with initialization of variables (step 101). In the illustrative preferred embodiment, initialization involves initialization of variables HBTCode (which represents the hybrid binary/thermometer code generated by the controller, and includes all of the hybrid binary/thermometer code bits controlling the impedance legs of the impedance network), BinaryCode (which keeps track of the active binary bits in the HBTCode), ThermometerCode (which keeps track of the active thermometer bits in the HBTCode), IncrementallySaturated (which is a Boolean variable set to True only when the variable HBTCode is incrementally saturated (i.e., all bits of the variable HBTCode are set to "1")), and DecrementallySaturated (which is a Boolean variable set to True only when the variable HBTCode is decrementally saturated (i.e., all bits of the variable HBTCode are set to "0")). Initialization (step 101) results in setting all bits of each of HBTCode, BinaryCode, and ThermometerCode to "0", IncrementallySaturated to False, and DecrementallySaturated to True. All set pairs of binary bits and corresponding thermometer bits are entered into a collection of available set pairs.

The method 100 then determines whether any available set pairs of binary bits and corresponding thermometer bits are available in the collection of available set pairs (step 102). Immediately after initialization, the number of available set pairs will be maximized, and accordingly, the method 100 selects a set of binary bits and its corresponding set of thermometer bits from the collection of available set pairs (step 104), thereby removing the selected sets from the collection of available set pairs. The selection of bit pairs is preferably performed according to a priority scheme. In the illustrative embodiment, the priority scheme involves selection of the set comprising the lowest order binary bits in the collection of set pairs, and its corresponding thermometer bits set.

The method 100 then activates the binary bits in the variable BinaryCode that correspond to the binary bits in the selected set of binary bits (step 105). The bits in the variable BinaryCode correspond to like bits in the variable HBTCode. If a bit in the variable BinaryCode is set to a "1", then the corresponding bit in the HBTCode is active and is included during a binary increment or decrement of the binary bits of the HBTCode (discussed hereinafter). If a bit in the variable BinaryCode is set to a "0", then the corresponding bit in the HBTCode is inactive and is not included during a binary increment or decrement of the binary bits of the HBTCode. Accordingly, a binary bit in the variable HBTCode is activated by setting the corresponding binary bits in the variable BinaryCode to a "1", and is deactivated by setting the corresponding thermometer bit in the variable BinaryCode to a "0".

The method 100 then activates the thermometer bits in the variable ThermometerCode that correspond to the thermometer bits in the selected set of thermometer bits (step 106). The bits in the variable ThermometerCode correspond to like bits in the variable HBTCode. If a bit in the variable ThermometerCode is set to a "1 ", then the corresponding bit in the HBTCode is active and is included during a thermometer increment or decrement of the thermometer bits of the HBTCode (discussed hereinafter). If a bit in the variable ThermometerCode is set to a "0", then the corresponding bit in the HBTCode is inactive and is not included during a thermometer increment or decrement of the thermometer bits of the HBTCode. Accordingly, a thermometer bit in the variable HBTCode is activated by setting the corresponding thermometer bit in the variable ThermometerCode to a "1", and is deactivated by setting the corresponding thermometer bit in the variable ThermometerCode to a "0".

The method 100 then waits for a step instruction (step 107). Upon receipt of a step instruction, the method 100 determines whether the step is to be in the "up" direction or the "down" direction (step 108).

If the step instruction indicates that the step is to be in the "up" direction, the method 100 determines whether the variable HBTCode is incrementally saturated (i.e., whether all bits in the variable HBTCode have a value of "1") (step 109). If so, the hybrid binary/thermometer code is already incremented to its limit, so the method 100 returns to wait for a next step instruction (step 107). If the variable HBTCode is not incrementally saturated, the method 100 performs a binary increment of the active binary bits (as indicated by the variable BinaryCode) of variable HBTCode (step 110). The method 100 then determines whether the binary increment resulted in an overflow of the active binary bits (step 111). If not, the method 100 returns to wait for a next step instruction (step 107). If, however, the binary increment did result in an overflow of the active binary bits (as determined in step 111), the method then performs a thermometer increment of the active thermometer bits (as indicated by the variable ThermometerCode) of variable HBTCode (step 112). The method 100 then determines whether the thermometer increment resulted in saturation of the active thermometer bits (step 113). If not, the method 100 returns to wait for a next step instruction (step 107). If, however, the thermometer increment did result in saturation of the active thermometer bits (as determined in step 113), the method then determines whether there are any existing available set pairs of binary bits and thermometer bits in the collection of available set pairs (step 102). If there are existing available set pairs of binary bits and thermometer bits in the collection of available set pairs, the method selects the next set pair of binary bits and thermometer bits (step 104), activates the binary bits in the HBTCode corresponding to the binary bits in the selected set of binary bits (step 105), activates the thermometer bits in the HBTCode corresponding to the thermometer bits in the selected set of thermometer bits (step 106), and returns to wait for the next step instruction (step 107).

If there are no more existing available set pairs of binary bits and thermometer bits in the collection of available set pairs, the variable HBTCode is incrementally saturated, and the method 100 sets the variable IncrementallySaturated to True, and returns to wait for the next step instruction (step 107).

Figure 3C:
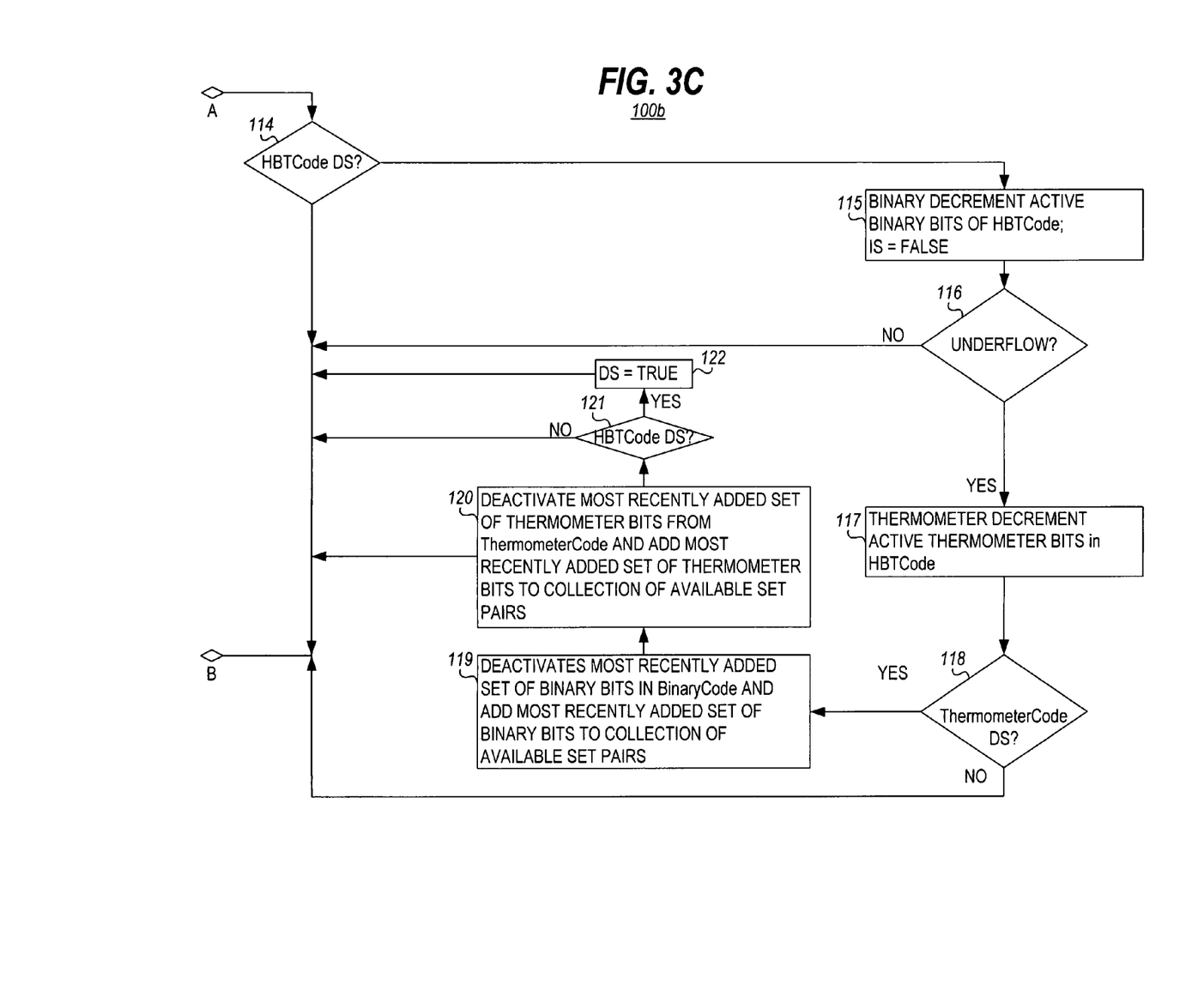
FIG. 3C is a second part of the flowchart of the preferred embodiment of the invention.

Returning now to receipt of a step instruction (step 107), if the step instruction indicates that the step is to be in the "down" direction (as determined in step 108), the method 100 enters method part 100b, shown in FIG. 3C, where it determines whether the variable HBTCode is decrementally saturated (i.e., whether all bits in the variable HBTCode have a value of "0") (step 114). If so, the hybrid binary/thermometer code is already decremented to its limit, so the method 100 returns to wait for a next step instruction (step 107). If the variable HBTCode is not decrementally saturated, the method 100 performs a binary decrement of the active binary bits (as indicated by the variable BinaryCode) of variable HBTCode (step 115). The method 100 then determines whether the binary decrement resulted in an underflow of the active binary bits (step 116). If not, the method 100 returns to wait for a next step instruction (step 107). If, however, the binary decrement did result in an underflow of the active binary bits (as determined in step 116), the method then performs a thermometer decrement of the active thermometer bits (as indicated by the variable ThermometerCode) of variable HBTCode (step 117). The method 100 then determines whether the thermometer decrement resulted in decremental saturation of the active thermometer bits (i.e., all active thermometer bits are "0") (step 118). If not, the method 100 returns to wait for a next step instruction (step 107). If, however, the thermometer increment did result in decremental saturation of the active thermometer bits (as determined in step 113), the method 100 then determines and deactivates the most recently activated set of binary bits in the variable BinaryCode, and adds the deactivated set of binary bits to the collection of available set pairs (step 119). The method 100 then determines and deactivates the most recently activated set of thermometer bits in the variable ThermometerCode, and adds the deactivated set of thermometer bits to the collection of available set pairs (step 120).

The method 100 then determines whether the variable HBTCode is decrementally saturated (i.e., whether any remaining sets of active binary bits and thermometer bits exist in the variables BinaryCode and ThermometerCode) (step 121). If the variable HBTCode is not decrementally saturated, the method 100 returns to wait for the next step instruction (step 107). If, however, the variable HBTCode is decrementally saturated, and the method 100 sets the variable DecrementallySaturated to True (step 122), and returns to wait for the next step instruction (step 107).

Figure 4:
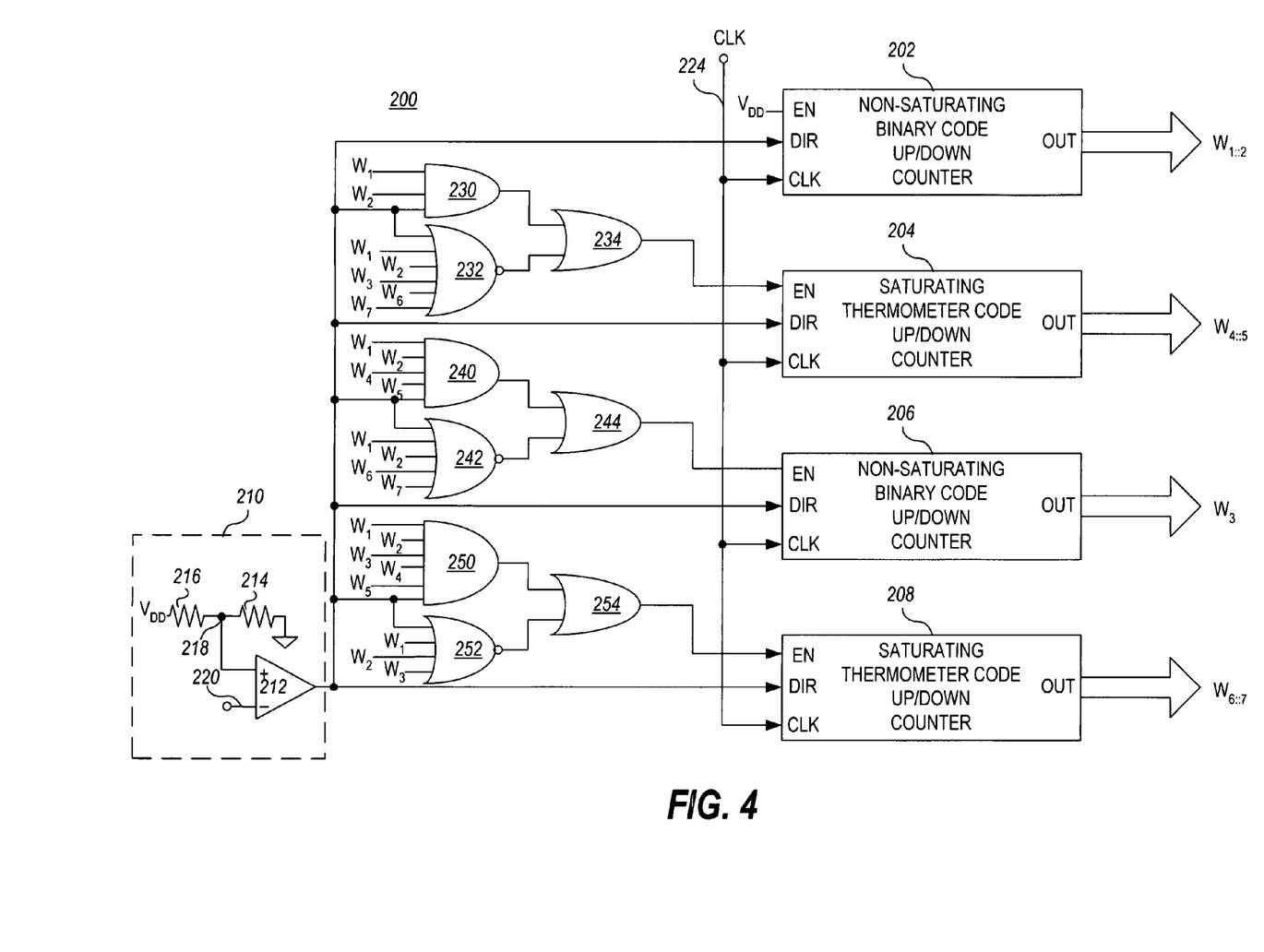
FIG. 4 is a schematic block diagram of a control circuit for variably adjusting an output impedance of an impedance networks.

FIG. 4 is a schematic block diagram of an example control circuit 200 that could be used to implement the method 100 of FIGS. 3A-3C and/or control circuit 9 for programming the impedance network 10 of FIGS. 1 and 2. As shown, the control circuit 200 includes a non-saturating 2-bit binary up/down counter 202, a saturating 2-bit thermometer up/down counter 204, a non-saturating 1-bit binary up/down counter 206, and a saturating 2-bit thermometer up/down counter 208.

Binary up/down counters 202 and 206 perform a binary increment or decrement on the binary value at their respective outputs according to the directional state of input DIR when the clock input, CLK, is strobed. The binary output values of counters 202 and 206 respectively correspond to calibration word bit sets $W_{1::2}$ and $W_3$. When the count is set to the highest output (i.e., all "1"s) and the direction is set to increment, non-saturating binary up/down counters 202 and 206 operate to roll over from the highest output to the lowest output (i.e., all "0"s) upon a receipt of a next clock cycle (assuming the counter is enabled); likewise, when the count is set to the lowest output (i.e., all "0"s) and the direction is set to decrement, non-saturating binary up/down counters 202 and 206 operate to roll over from the lowest output to the highest output (i.e., all "1"s) upon a receipt of a next clock cycle (assuming the counter is enabled).

Thermometer up/down counters 204 and 208 perform a thermometer increment or decrement on the thermometer value at their respective outputs according to the directional state of input DIR when the clock input, CLK, is strobed. The thermometer output values of counters 204 and 208 respectively correspond to calibration word bit sets $W_{4::5}$ and $W_{6::7}$. Saturating thermometer up/down counters 204 and 208 do not roll over from the highest output to the lowest or visa-versa.

Each counter 202, 204, 206, 208 is configured with a respective enable input EN which, when asserted, allows the respective counter to increment or decrement (depending on the state of the direction input DIR) once for each strobe of the clock input signal CLK. In order to implement the hybrid binary/thermometer code of TABLE 3, each of the higher-order counters 204, 206, and 208 are only enabled during certain times of the programming process. In the embodiment of FIG. 4, counter 202 is always enabled—therefore, assuming a positive-true logic scheme, the enable input EN of the counter 202 is tied to $V_{DD}$.

Counter 204 is enabled only when both binary bits $W_1$ and $W_2$ are "1" and the direction signal DIR is set to increment (i.e., is set to a logic high in a positive-true logic scheme), or when all binary bits $W_1$, $W_2$, and $W_3$ and thermometer bits $W_6$ and $W_7$ are each "0" and the direction signal DIR is set to decrement (i.e., is set to a logic low in a positive-true logic scheme). Accordingly, the control circuit 200 includes an AND gate 230 (or equivalent logic) with inputs $W_1$, $W_2$, and DIR, a NOR gate 232 (or equivalent logic) with inputs $W_1$, $W_2$, $W_3$, $W_6$, $W_7$, and DIR, and an OR gate 234 (or equivalent logic) with the outputs of the AND gate 230 and NOR gate 234 as inputs. The output of the OR gate 234 is connected to the enable input EN of the saturating thermometer code up/down counter 204.

Counter 206 is enabled only when binary bits $W_1$ and $W_2$ and thermometer bits $W_4$ and $W_5$ are each "1" and the direction signal DIR is set to increment, or when binary bits $W_1$ and $W_2$ and thermometer bits $W_6$ and $W_7$ are each "0" and the direction signal DIR is set to decrement. Accordingly, the control circuit 200 includes an AND gate 240 (or equivalent logic) with inputs $W_1$, $W_2$, $W_4$, $W_5$, and DIR, a NOR gate 242 (or equivalent logic) with inputs $W_1$, $W_2$, $W_6$, $W_7$, and DIR, and an OR gate 244 (or equivalent logic) with the outputs of the AND gate 240 and NOR gate 244 as inputs. The output of the OR gate 244 is connected to the enable input EN of the non-saturating binary code up/down counter 206.

Counter 208 is enabled only when binary bits $W_1$, $W_2$, and $W_3$ and thermometer bits $W_4$ and $W_5$ are each "1" and the direction signal DIR is set to increment, or when binary bits $W_1$, $W_2$, and $W_3$ are each "0" and the direction signal DIR is set to decrement. Accordingly, the control circuit 200 includes an AND gate 250 (or equivalent logic) with inputs $W_1$, $W_2$, $W_3$, $W_4$, $W_5$, and DIR, a NOR gate 252 (or equivalent logic) with inputs $W_1$, $W_2$, and $W_3$ and DIR, and an OR gate 254 (or equivalent logic) with the outputs of the AND gate 250 and NOR gate 254 as inputs. The output of the OR gate 254 is connected to the enable input EN of the saturating thermometer code up/down counter 208.

The direction input DIR is controlled by a comparator circuit 210. Conductor 7 at the output of the impedance network 10 is an input to the inverting terminal of analog comparator 212. The non-inverting input of analog comparator 212 is connected to a voltage divider formed with resistive devices 214 and 216. Resistive devices 214 and 216 may be on-chip resistors (or equivalents thereof) and are connected in series between the positive supply and the negative supply with the intermediate node connected to the non-inverting input of analog comparator 212. In one embodiment, resistors 214 and 216 have the same value so that the voltage at the non-inverting input of analog comparator 212 is VDD/2. The output 222 of analog comparator 212 is connected to the DIR input of each of counters 202, 204, 206, and 208, which controls the direction that the counters count, if enabled.

When the inverting input of comparator 212 is lower than the non-inverting input of analog comparator 212, counters 202, 204, 206, and 208, count up (when enabled) to turn on more of the transistors of impedance network 10 to decrease the impedance of impedance network 10. This feedback system stabilizes when the impedance of impedance network 10 nearly matches the impedance of the load driven by the pad 8. When the inverting input of comparator 212 is higher than the non-inverting input of analog comparator 212, the output 222 corresponding to direction signal DIR is 0, which instructs the counters 202, 204, 206, and 208 to count in the down direction. This turns off more of the transistors of impedance network 10, thereby increasing the impedance of impedance network 10.

It will be appreciated that the method 100 of FIG. 3 and the control circuit 200 of FIG. 4 allow continuous and/or periodic adjustment to the output impedance of the output pad 8 of output driver circuit 1 via continuous and/or periodic adjustment of the calibration control word $W_{1::7}$.

The method 100 of FIGS. 3A-3C and the control circuit 200 of FIG. 4 are provided herein merely as illustrative of how the calibration word $W_{1::7}$ that implements the hybrid binary/thermometer code of TABLE 3 and controls the impedance network 10 may be generated. However, it will be appreciated that various methods and circuits may be designed to implement the hybrid binary/thermometer code of the invention that is used to vary the output impedance of the driver circuits so that the output resistance substantially matches the load impedance over various ranges of the process, voltage, and temperature. Consistent with the concepts and teachings of the present invention, the control circuit 9 (FIGS. 1 and 2) and/or method of generation of the hybrid binary/thermometer code of the invention (FIGS. 3A-3C) may be implemented in a variety of ways, and the illustrative embodiments presented herein are for purposes of illustration only and not limitation.

The foregoing description has been presented for purposes of illustration and description. It is not intended to be exhaustive or to limit the invention to the precise forms disclosed. Obvious modifications or variations are possible in light of the above teachings. For example, it will be appreciated that the number of impedance legs in the impedance network and corresponding number of bits of the calibration word may be increased or decreased according to the needs of the application.

It will also be appreciated that the weighting of the impedance legs, the number and allocation of impedance legs to impedance leg sets, and corresponding calibration word bits to various pairs of sets of binary bits and thermometer bits may be varied to achieve the desired range and sensitivity of the impedance network.

It will also be appreciated that the variable impedance network may be connected to more than one output pad and used to simultaneously and globally adjust the output impedance of these more than one output pads. Further, although the illustrative embodiment illustrates the use of a variable impedance network in accordance with the invention for both the pull-up and the pull-down portions of a driver circuit, more precise impedance matching over various process, voltage, and temperature ranges may be achieved by implementing separate impedance networks for each of the pull-up and the pull-down portions of a driver circuit, and may or may not implement separate and independent calibration words for the separate impedance networks of the pull-up and the pull-down portions of a driver circuit.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A method of operating a hybrid binary/thermometer code, the method comprising:

setting a least significant bit (LSB) of a combination of bits, to a logic one state that remains unchanged for all combinations of the hybrid binary/thermometer code;

predefining a first set of bits located above the LSB, the first set of bits configured for setting a desired binary code; and predefining a second set of bits above the first set of bits, the second set of bits configured for setting a desired thermometer code, and wherein the combination of the LSB, the first set of bits, and the second set of bits constitutes the hybrid binary/thermometer code.

2. The method of claim 1, further comprising:

for each incrementing step of said hybrid binary/thermometer code:

incrementing said first set of bits according to a binary increment; and if said second set of bits is not fully incremented, incrementing said second set of bits according to a thermometer code increment upon overflow of said first set of bits.

3. The method of claim 2, further comprising:

for each decrementing step of said hybrid binary/thermometer code:

decrementing said first set of bits according to a binary decrement; and if said second set of bits is not fully decremented, decrementing said second set of bits according to a thermometer code decrement upon underflow of said first set of bits.

4. The method of claim 1, wherein the combination of bits is a byte, with the LSB corresponding to bit position 0, the first set of bits corresponding to bit positions 1 though 3, and the second set of bits corresponding to bit positions 4 through 7.

5. The method of claim 4, further comprising:

predefining a first subset in the first set of bits, the first subset configured for setting at least a portion of the desired binary code; and predefining a first corresponding subset in the second set of bits, the first corresponding subset configured for setting at least a portion of the desired thermometer code.

6. The method of claim 5, wherein at least one of the first subset or the first corresponding subset comprises a pair of bits.

7. The method of claim 4, further comprising:

predefining a plurality of subsets in the first set of bits;

predefining a plurality of corresponding subsets in the second set of bits;

using a priority scheme for selecting amongst the plurality of subsets, a first subset having the lowest order of binary bits;

using the priority scheme for selecting amongst the plurality of corresponding subsets, a first corresponding subset having the lowest order of thermometer bits;

performing one of an incrementing or a decrementing operation on the first subset; and performing one of a corresponding incrementing or a corresponding decrementing operation on the first corresponding subset.

8. A variable impedance network incorporating a hybrid binary/thermometer code, the variable impedance network comprising:

a first impedance element configured to provide a fixed impedance between a pair of nodes;

a first plurality of impedance elements each having a weighted impedance relative to the fixed impedance, and each configured for selective coupling, in parallel with the first impedance element, between the pair of nodes;

a second plurality of impedance elements each having a weighted impedance relative to the fixed impedance, and each configured for selective coupling, in parallel with the first impedance element, between the pair of nodes; and a control circuit configured to use the hybrid binary/thermometer code wherein a binary code is used for selectively coupling at least one of the first plurality of impedance elements between the pair of nodes, and a thermometer code is used for selectively coupling at least one of the second plurality of impedance elements between the pair of nodes.

9. The variable impedance network of claim 8, wherein the first plurality of impedance elements comprises three impedance elements, and the second plurality of impedance elements comprises four impedance elements.

10. The variable impedance network of claim 9, wherein the control circuit implements the binary code using a first set of bits corresponding to bit positions 1 though 3 of a control byte, and implements the thermometer code using a second set of bits corresponding to bit positions 4 though 7 of the control byte.

11. The variable impedance network of claim 8, wherein each of the first and the second plurality of impedance elements comprises a field effect transistor (FET).

12. The variable impedance network of claim 11, wherein the first impedance element comprises a FET.

13. The variable impedance network of claim 11, wherein the first impedance element comprises a resistor.

14. The variable impedance network of claim 8, wherein the control circuit comprises:

a non-saturating counter for carrying out one of an incrementing step or a decrementing step in accordance with the binary code; and a saturating counter for carrying out one of an incrementing step or a decrementing step in accordance with the thermometer code.

15. The variable impedance network of claim 8, wherein the pair of nodes comprises an output node of a driver circuit.

16. A variable impedance network incorporating a hybrid binary/thermometer code, the variable impedance network comprising:

a first impedance element configured to provide a fixed admittance $Y_0$ between a pair of nodes;

a first field effect transistor (FET) having an admittance $Y_1$ equal to a first percentage of the fixed admittance $Y_0$, the first FET configured for selective coupling between the pair of nodes in parallel with the first impedance element;

a second FET having an admittance $Y_2$ equal to a second percentage of the fixed admittance $Y_0$, the second FET configured for selective coupling between the pair of nodes in parallel with the first impedance element;

a third FET having an admittance $Y_3$ equal to a third percentage of the fixed admittance $Y_0$, the third FET configured for selective coupling between the pair of nodes in parallel with the first impedance element;

a fourth FET having an admittance $Y_4$ equal to a fourth percentage of the fixed admittance $Y_0$, the fourth FET configured for selective coupling between the pair of nodes in parallel with the first impedance element;

a fifth FET having an admittance $Y_5$ equal to a fifth percentage of the fixed admittance $Y_0$, the fifth FET configured for selective coupling between the pair of nodes in parallel with the first impedance element;

a sixth FET having an admittance $Y_6$ equal to a sixth percentage of the fixed admittance $Y_0$, the sixth FET configured for selective coupling between the pair of nodes in parallel with the first impedance element;

a seventh FET having an admittance $Y_7$ equal to a seventh percentage of the fixed admittance $Y_0$, the seventh FET configured for selective coupling between the pair of nodes in parallel with the first impedance element; and a control circuit configured to use the hybrid binary/thermometer code wherein a binary code is used for selectively coupling at least one of the first, second and third FETs between the pair of nodes, and a thermometer code is used for selectively coupling at least one of the fourth, fifth, sixth, and seventh FETs between the pair of nodes.

17. The variable impedance network of claim 16, wherein the first impedance element comprises an eighth FET configured to remain in a constant on state during implementation of the hybrid binary/thermometer code.

18. The variable impedance network of claim 16, wherein at least two of the first, second or third percentages are equal to one another.

19. The variable impedance network of claim 16, wherein at least one of the first, second or third percentages is equal to at least one of the fourth, fifth, sixth, or seventh percentages.

20. The variable impedance network of claim 16, wherein the control circuit comprises:

a non-saturating counter for carrying out one of an incrementing step or a decrementing step in accordance with the binary code; and a saturating counter for carrying out one of an incrementing step or a decrementing step in accordance with the thermometer code.

* * * * *